(12) United States Patent
Wang et al.

(10) Patent No.: US 9,568,543 B2
(45) Date of Patent: Feb. 14, 2017

(54) STRUCTURE AND METHOD FOR TESTING STACKED CMOS STRUCTURE

(71) Applicant: Taiwan Semiconductor Manufacturing Co., Ltd., Hsin-Chu (TW)

(72) Inventors: Mill-Jer Wang, Hsinchu (TW); Ching-Nen Peng, Hsinchu (TW); Hung-Chih Lin, Hsinchu (TW); Hao Chen, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 510 days.

(21) Appl. No.: 14/062,935

(22) Filed: Oct. 25, 2013

(65) Prior Publication Data
US 2015/0115993 A1 Apr. 30, 2015

(51) Int. Cl.
G01R 31/28 (2006.01)
G01R 31/3185 (2006.01)
H01L 21/66 (2006.01)
H01L 27/06 (2006.01)

(52) U.S. Cl.
CPC ....... G01R 31/2851 (2013.01); G01R 31/2884 (2013.01); G01R 31/318513 (2013.01); H01L 22/34 (2013.01); H01L 27/0688 (2013.01)

(58) Field of Classification Search
CPC ............ G01R 31/2851; G01R 31/2884; G01R 31/318513; H01L 22/34; H01L 27/0688
USPC .................................................. 324/762.03
See application file for complete search history.

(56) References Cited

U.S. PATENT DOCUMENTS

| 4,223,337 A | 9/1980 | Kojima et al. | |
|---|---|---|---|
| 2004/0185637 A1* | 9/2004 | Fu | H01L 21/76229 438/401 |
| 2006/0234403 A1* | 10/2006 | Li | H01L 21/76838 438/14 |
| 2007/0069365 A1* | 3/2007 | Archer | G01R 31/2884 257/700 |
| 2007/0096092 A1* | 5/2007 | Huang | H01L 23/585 257/48 |
| 2008/0191205 A1* | 8/2008 | Tsai | H01L 22/34 257/48 |
| 2012/0286814 A1 | 11/2012 | Wang et al. | |

OTHER PUBLICATIONS

Chan, M., "Stacked CMOS Technologies" Springer, Chapter 3, Wafer Level 3-D ICs Process Technology, Integrated Circuits and Systems, 2008, pp. 1-17.

* cited by examiner

Primary Examiner — Jermele M Hollington
Assistant Examiner — Khristopher Yodichkas
(74) Attorney, Agent, or Firm — Duane Morris LLP (57) ABSTRACT

A test structure is provided for testing a semiconductor structure having a plurality of tiers. The test structure includes at least one conductive loop. Each respective conductive loop has ends defining at least one opening between the ends, and is embedded inside one or more of the plurality of tiers in the semiconductor structure. The test structure also includes at least two test pads on each respective conductive loop. The at least two test pads are connected with respective ends of each respective conductive loop. The test structure is configured to permit detection of defects within each of the plurality of tiers in the semiconductor structure if the defects exist, using a testing apparatus.

18 Claims, 12 Drawing Sheets

STRUCTURE AND METHOD FOR TESTING STACKED CMOS STRUCTURE

FIELD

The disclosed system and method relate to semiconductors. More particularly, the disclosed subject matter relates to a test structure and a method for verifying three-dimensional integrated circuits (3D IC).

BACKGROUND

Developments in integrated circuit technology have often focused on improving the integration density of various electronic components, such as transistors, capacitors, diodes, resistors, and inductors, into a given chip or wafer area. Various improvements have involved the reduction of minimum component size, permitting more components to be integrated on the surface of the semiconductor die. Such two-dimensional (2D) integration density improvements are physically limited by device size, the size of the die, and other limitations including the complexity of design, such as, for example, the requisite length and number of interconnections between devices, and the corresponding circuit delay and power consumption increases.

Three-dimensional integrated circuits (3D-IC) and stacked wafers or dies are used to resolve some of the limitations of 2D integrated circuits. In some 3D IC, plural dies are stacked vertically within a single package and electrically connected to each other. Through substrate vias (also referred to as through silicon vias), TSVs, are often used in stacked wafer/die packaging structures to connect the wafers or dies in 3D-IC structures. TSVs are vertical openings passing completely though semiconductor substrates and filled with conductive material to provide connections between stacked wafers or dies, or between front and back surfaces of a die. The total interconnect length of the integrated circuits has been found to decrease as the dies or wafers are integrated in 3D style instead of 2D fashion.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Stacked CMOS structures comprise circuit elements placed three dimensionally in multiple tiers (or tiers). Each tier can have a respective semiconductors substrate or semiconductor tier, and a respective interconnect structure above the semiconductor substrate, semiconductor layer or a dielectric substrate layer. In some stacked CMOS structures, each tier can also have a portion of an integrated circuit. In other stacked CMOS structures, one or more of the tiers has an interconnect structure with conductive (e.g., metal) lines, without any active devices in the semiconductor substrate or semiconductor tier of that tier. Intertier vias (ILVs), shorter and smaller in diameter than TSVs, are used to connect the circuit elements in different tiers from each other.

Figure 1:
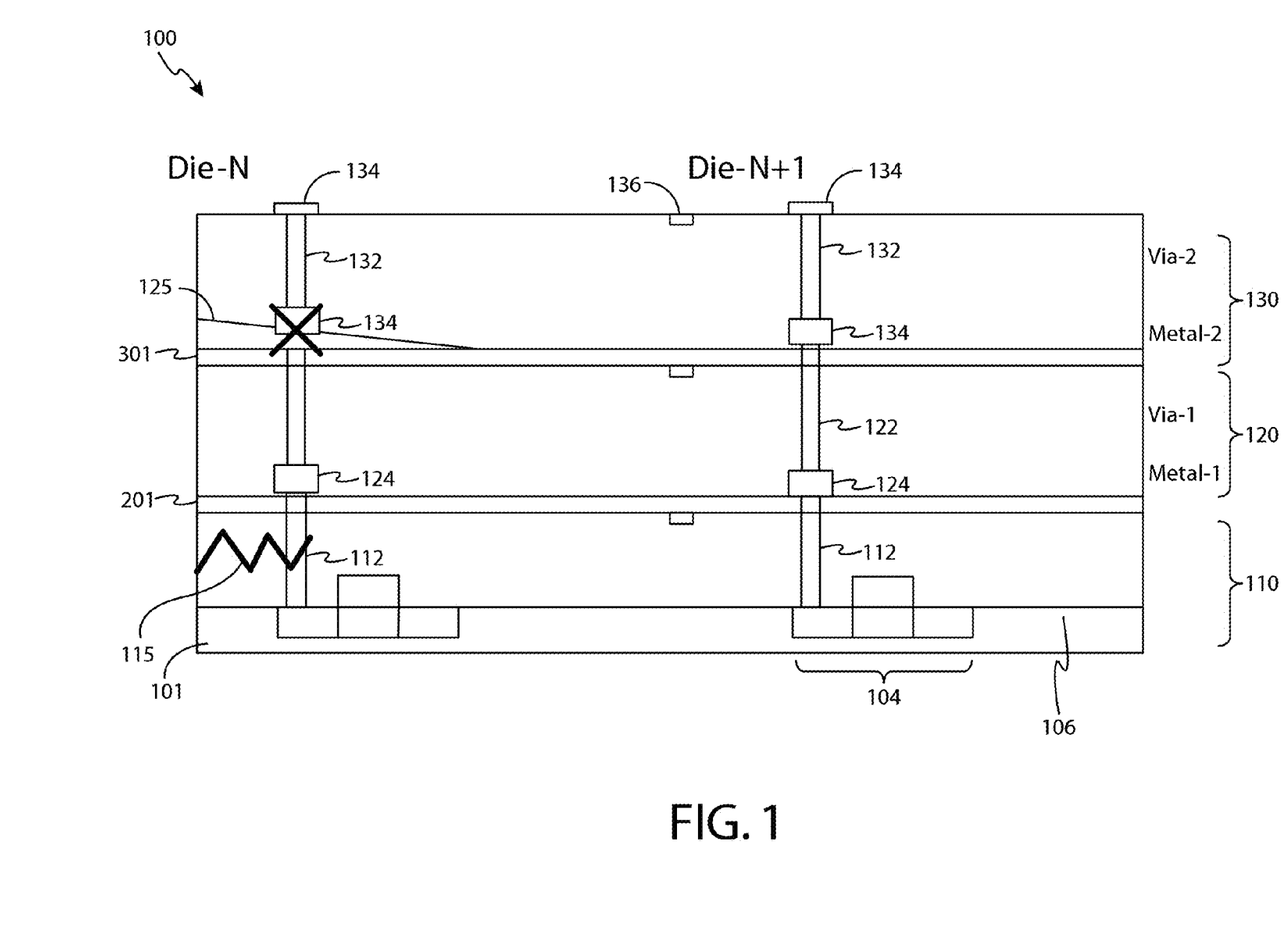
FIG. 1 illustrates a cross-sectional view of a 3D semiconductor structure having multiple tiers, in which defects exist.

Referring to FIG. 1, a 3D semiconductor structure having multiple tiers such as a stacked CMOS structure may contain defects within one or more of the tiers or between two adjacent tiers. In FIG. 1, an exemplary stacked CMOS structure 100 comprises a base tier 110, a first tier 120 and a second tier 130 above the base tier 110. The base tier 110 comprises circuit elements 104 such as an NMOS transistor 104 and vias 112 in a dielectric material 106 in or throughout the substrate 101. The first tier 120 can comprise metal lines 124 and vias 122 over a substrate 201. Similarly, the second tier 130 can comprise metal lines 134 and vias 132 over a substrate 301. Substrates 201 and 301 can be a semiconductor layer or a dielectric layer. Each tier 110, 120, or 130 can comprise scribe lines 136. Each tier can have a thickness at the level of microns, for example, in the range of from 1 µm to 10 µm. The thin tiers may warp or chip to cause defects such as cracks 115 within a single tier or open cracks 125 between adjacent tiers. These defects may disconnect the vias or circuit elements.

The present disclosure provides a test structure for testing a semiconductor structure having a plurality of tiers, a semiconductor structure comprising such a test structure, a system and a method for testing a semiconductor structure using such a test structure. The test structure is configured to permit detection of defects within each of the plurality of tiers in the semiconductor structure if the defects exist, using a testing apparatus.

For brevity, references to a semiconductor structure made below will be understood to encompass any 3D semiconductor structure having a plurality of tiers and being fabricated or having been fabricated. Examples of a suitable semiconductor structure include but are not limited to a semiconductor structure comprising a stacked CMOS structure, and a semiconductor structure comprising three-dimensional (3D) integrated circuits. In some embodiments, such a semiconductor structure can be a stacked CMOS structure being fabricated in a wafer. References to a test structure made below will be understood to encompass a structure included or built within a semiconductor structure for testing such a semiconductor structure. Such a test structure can comprise conductive paths separate from active devices in the semiconductor structure, or share some conductive paths such as contacts or vias connected to the active devices in the semiconductor structure.

Figure 2:
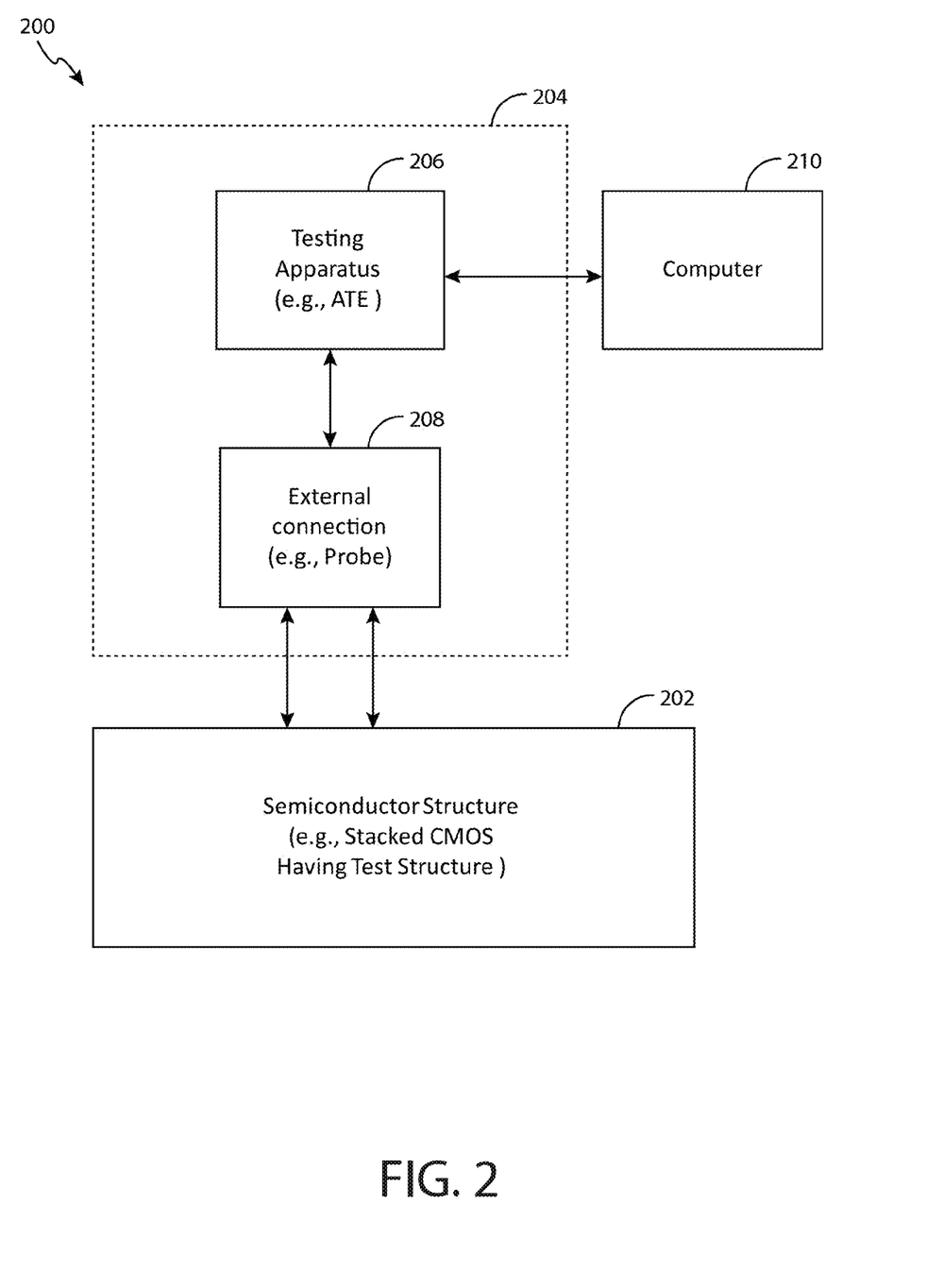
FIG. 2 is a block diagram illustrating a system comprising a stacked CMOS structure having a test structure.

FIG. 2 is a block diagram illustrating a system 200 for testing a 3D semiconductor structure 202. In some embodiments, the 3D semiconductor structure 202 is a stacked CMOS structure having a test structure. In some embodiments, semiconductor structure 202 is a structure comprising a stacked CMOS device, or a wafer comprising 3D-ICs. Semiconductor structure 202 comprises a device under testing (DUT). A testing apparatus 206 such as automatic testing equipment (ATE) in an external tester 204 is coupled to semiconductor structure 202 through a plurality of testing channels or external connections 208 (e.g., testing probes). Testing channels or external connections 208 can be a portion of testing apparatus 206 in some embodiments. Testing apparatus 206 can also comprise a probe card. Testing apparatus 206 is configured to perform different tests on semiconductor structure 202, for example, applying a voltage and measuring a corresponding current to obtain a corresponding value of resistance. Testing apparatus 206 can be also connected with a processor such as a computer 210. The data obtained from testing apparatus 206 are analyzed and stored in computer 210 programmed to detect defects in semiconductor structure 202.

Figure 3A:
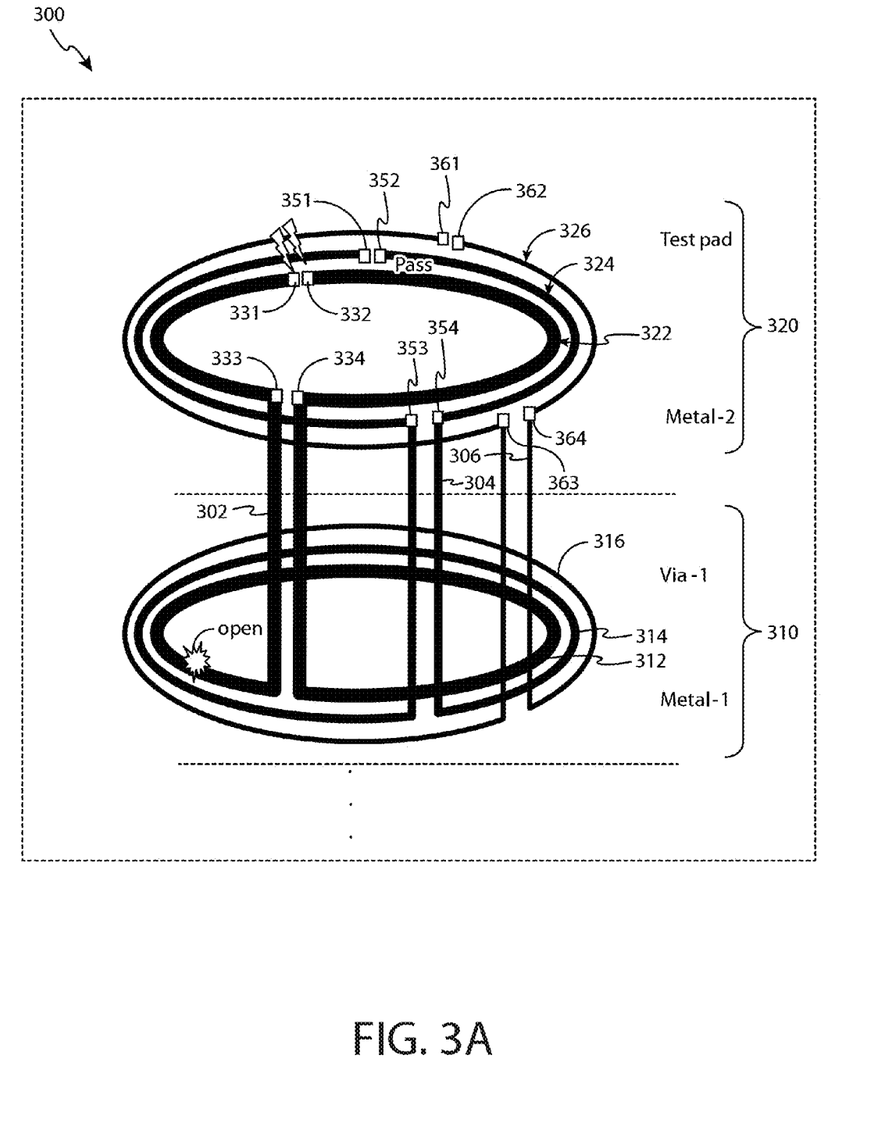
FIGS. 3A and 4A illustrate exemplary test structures having at least one conductive loop embedded in a plurality of tiers of a 3D semiconductor structure.

Referring to FIG. 3A, an exemplary test structure 300 comprises at least one conductive loop embedded inside one or more of the plurality of tiers in semiconductor structure in some embodiments. As shown in FIG. 3A, test structure 300 has three conductive loops across two tiers 310 and 320. The three conductive loops include loop 312-322, loop 314-324 and loop 316-326. Each respective conductive loop has ends defining at least one opening therebetween. For example, loop 312-322 has two openings in tier 320 as shown. At least two test pads on each respective conductive loop are connected with respective ends of each respective conductive loop. For example, a pair of test pads 331 and 332 (pad-1 and pad-2 in FIG. 3A), and another pair of test pads 333 and 334 (pad-3 and pad-4 in FIG. 3A) are connected to respective ends of the two openings in loop 312-322. Similarly, loop 314-324 has two pairs of test pads including pads 351-354. Loop 316-326 has two pairs of test pads including pads 361-364.

As shown in FIG. 3A, one respective conductive loop comprises at least one conductive ring or conductive paths in any other suitable shape. Loop 312-322 contains two conductive rings 312 and 322. Loop 314-324 contains two conductive rings 312 and 324. Loop 316-326 contains two conductive rings 316 and 326. In some embodiments, these conductive rings are at the periphery of the one or more tiers in the semiconductor structure. For example, conductive rings 312, 322, 314, 324, 316 and 326 are outside of the region occupied by active devices in the semiconductor structure, and can be close to the edge of the semiconductor structure. In each conductive loop, the at least one conductive ring is connected with each other conductive ring of the same loop through inter-level vias (302, 304 and 306) across two adjacent tiers of the semiconductor structure to form the respective conductive loop. An inter-level via passes completely through an upper tier semiconductor tier or upper tier semiconductor wafer of a 3D IC, from a top surface to a bottom surface of the upper semiconductor tier or wafer. In some embodiments, these inter-level vias (ILV) 302, 304 and 306 can be conductive paths connected to test structure 300, but which are not connected to active devices in the semiconductor structure. In some embodiments, ILV includes conductive lines and/or conductive vias.

In some embodiments, test structure 300 comprises at least two conductive loops having substantially identical shape, while each respective loop has a different line width. As shown in FIG. 3A, for example, loop 312-322, loop 314-324 and loop 316-326 have different line widths while having substantially identical shape. The variation in line width of conductive loops provides different testing sensitivity to process variations. In some embodiments, each respective loop has a similar line width.

Figure 3B:
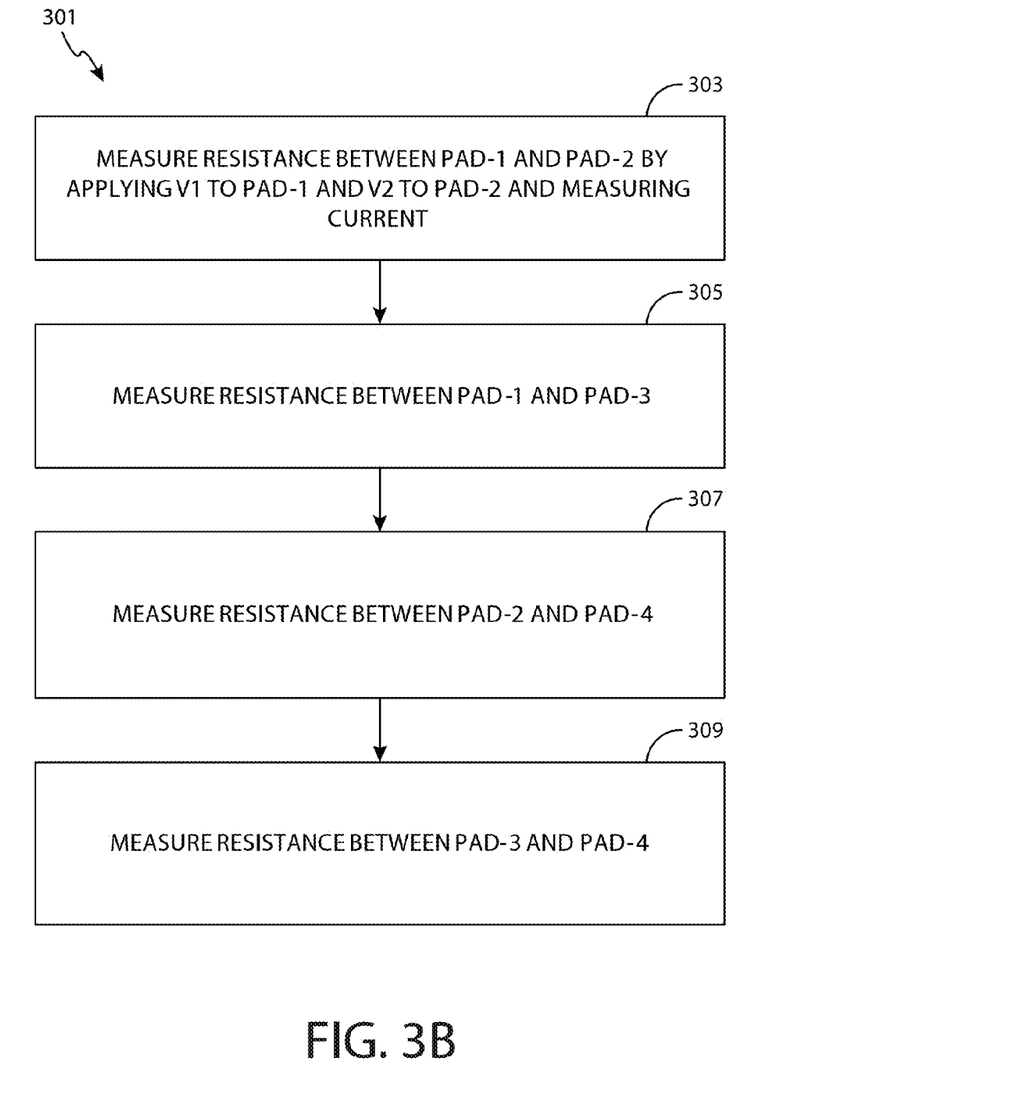
FIGS. 3B and 4B illustrate exemplary methods for testing a semiconductor structure having a test structure of FIGS. 3A and 4A, respectively.

FIG. 3B shows an exemplary method 301 for testing a 3D semiconductor structure having a test structure 300 as shown in FIG. 3A.

Taking loop 312-322 as an example, at step 303, a voltage (e.g., difference between $V_1$ and $V_2$) can be applied between testing pads 331 and 332 (pad 1 and pad 2). The corresponding resistance can be obtained by measuring the corresponding current. The value of resistance can be used to detect whether there is any defect in the whole loop 312-322. For example, a low value of resistance, for example, in the range of from 10 ohms to 100 ohms demonstrates normal connections at the periphery of tiers 310 and 320 where loop 312-322 goes through in the semiconductor structure. However, if a high value of resistance, for example, at the level of one million ohms, is obtained, such a result demonstrates existence of defects in the area adjacent to loop 312-322.

Similarly, at step 305, resistance between pads 331 and 333 (pad 1 and pad 3 of FIG. 3A) can be tested. A low value of resistance, for example, in the range of from 10 ohms to 100 ohms demonstrates good connections between these two pads in tier 320.

At step 307, resistance between pads 332 and 334 (pad 2 and pad 4 of FIG. 3A) can be tested. If a low value of resistance is obtained, good connection between these two pads in tier 320 exists. No defects may exist in tier 320.

At step 309, resistance between pads 333 and 334 (pad 3 and pad 4 of FIG. 3A) can be tested. If a high value of resistance (e.g., in the range of one million ohms) is obtained, one or more defects may exist in tier 310. As described, method 301 can be used to detect probable existence and location of any defects in different tiers.

Figure 4A:
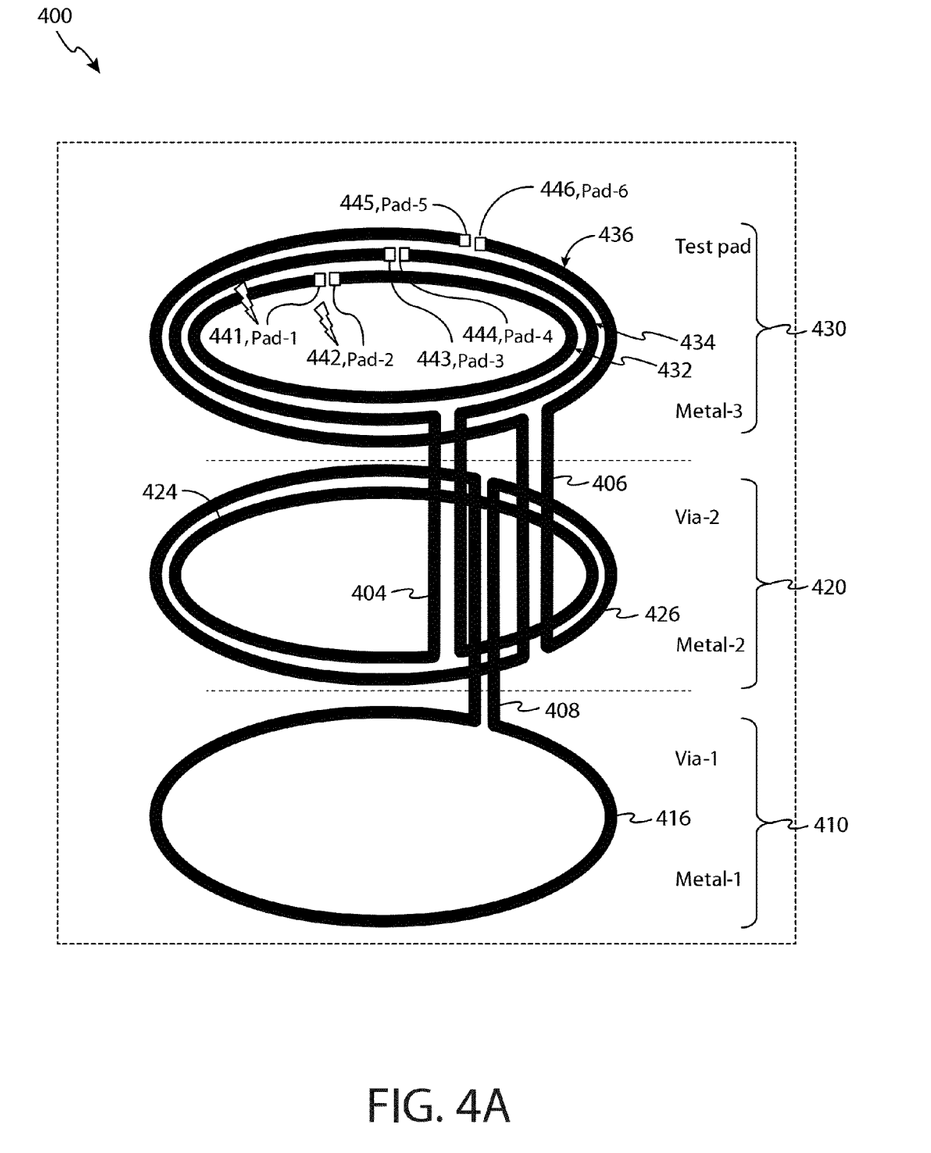

FIG. 4A illustrates another exemplary test structure 400 having at least one conductive loop embedded in a plurality of tiers 410, 420, 430 of a 3D semiconductor structure. Test structure 400 illustrates that in some embodiments, the at least one conductive loop comprises a first number of conductive loops having the same line width as each other. Each respective conductive loop is divided across a second number of tiers in the semiconductor structure. The second number is different from the first number.

As shown in FIG. 4A, test structure 400 comprises three conductive loops including loop 432, loop 424-434, and loop 416-426-436. These three loops have the same line width as each other. Loop 432 is embedded in tier 430 only. Loop 424-434 comprises two conductive rings 424 and 434, which are embedded in two tiers 420 and 430, respectively. Conductive rings 424 and 434 are connected with each other through inter-level vias 404 corresponding to the loop 424-434. Similarly, loop 416-426-436 comprises three conductive rings 416, 426 and 436 embedded in three tiers 410, 420 and 430, respectively. Conductive rings 416, 426 and 436 are connected with each other through corresponding inter-level vias 406 and 408. Test pads 441-446 (pad 1-pad 6 in FIG. 4A) are distributed in the three conductive loops as shown in FIG. 4A.

Figure 4B:
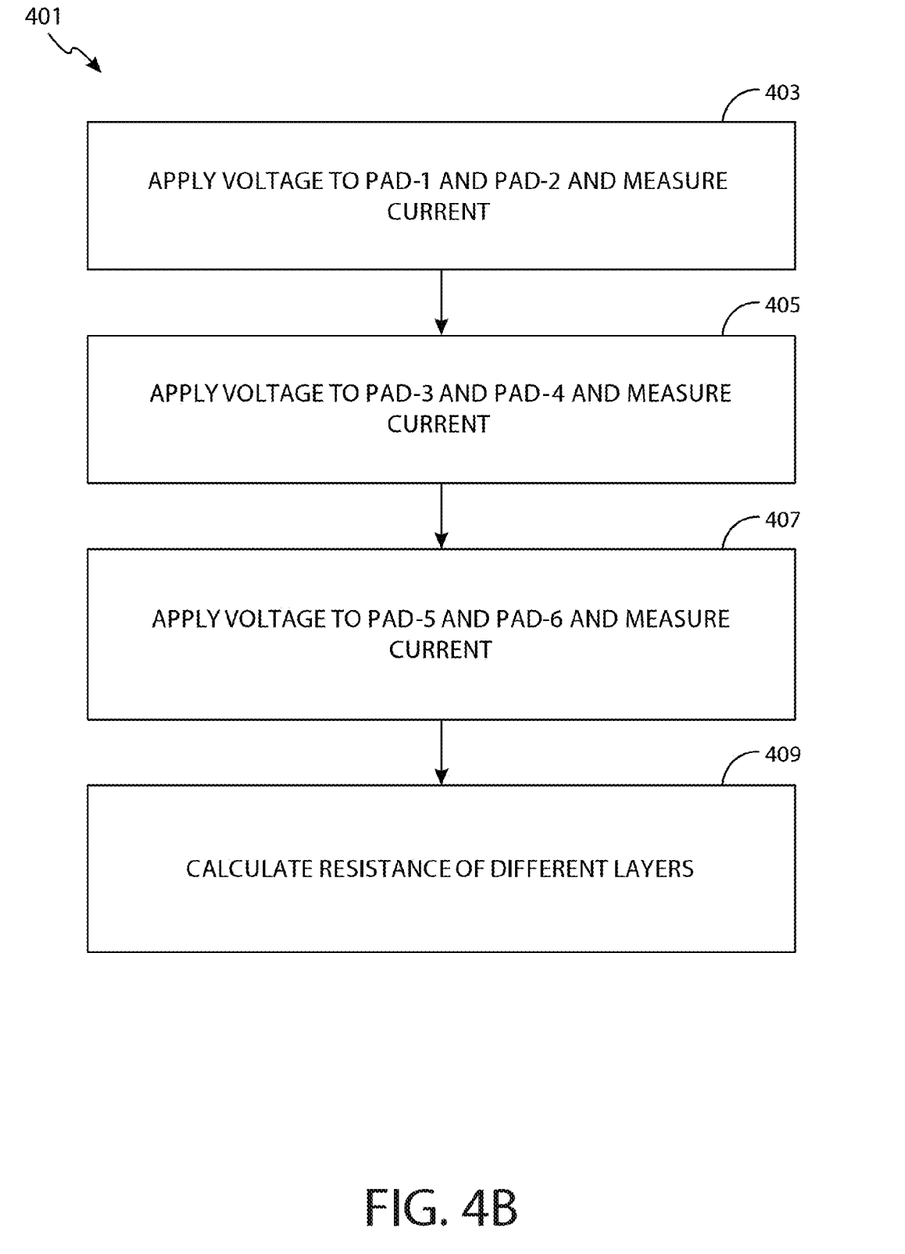

FIG. 4B shows an exemplary method 401 to test a 3D semiconductor structure having a test structure 400 as shown in FIG. 4A.

At step 403, a voltage ($V_{12}$) is applied to test pads 441 and 442 (pad 1 and pad 2 in FIG. 4A), and a corresponding current ($I_{12}$) is measured. At step 405, a voltage ($V_{34}$) is applied to test pads 443 and 444 (pad 3 and pad 4 in FIG. 4A), and a corresponding current ($I_{34}$) is measured. Similarly, at step 407, a voltage ($V_{56}$) is applied to test pads 445 and 446 (pad 5 and pad 6 in FIG. 4A), and a corresponding current ($I_{56}$) is measured. Each voltage is a difference in electrical potential between two respective pads. For example, $V_{12}$ is the difference between electrical potential of pad 1 and pad 2 (i.e. $V_{12}=V_1-V_2$).

At step 409, resistance of different tiers 410-430 can be calculated based on the data obtained at steps 403, 405 and 407. The following resistance values can be obtained:

$$R_{12}=V_{12}/I_{12},$$

$$R_{34}=V_{34}/I_{34},$$

$$R_{56}=V_{56}/I_{56}.$$

$R_{12}$ is resistance of conductive ring 432 in tier 430. $R_{34}$ is resistance of conductive ring 434 in tier 430, conductive ring 424 in tier 420 and inter-level vias 404 across tiers 420 and 430. $R_{56}$ is resistance of conductive ring 436 in tier 430, conductive ring 426 in tier 420, conductive ring 416 in tier 410, inter-level vias 406 across tiers 420 and 430, and inter-level vias 408 across tiers 410 and 420. Resistance of the conductive rings in the same tier with same length is considered to be the same, because each loop has substantially the same shape and line width. Similarly, inter-level vias across the same adjacent tiers have identical resistance.

Thus resistance of conductive rings and inter-level vias within each tier can be calculated. For example, $$R_{mv1}=R_{56}-R_{34},$$

$$R_{mv2}=R_{34}-R_{12},$$

$$R_{m3}=R_{12}$$

$R_{mv1}$ represents resistance of conductive rings ("metal-1") and inter-level vias ("via-1") in tier 410. $R_{mv2}$ represents resistance of conductive rings ("metal-2") and inter-level vias ("via-2") in tier 420. $R_{m3}$ represents resistance of conductive rings ("metal-3") in tier 430.

The values of resistance above can be used to detect presence of defects in one of tiers 410, 420 and 430 if there is any defect. A low value of resistance, for example, in the range of from 10 ohms to 100 ohms demonstrates normal connections at the periphery of each respective tier. A high value of resistance, for example, at the level of million ohms, indicates existence of defects at the periphery of a respective tier.

Figure 5:
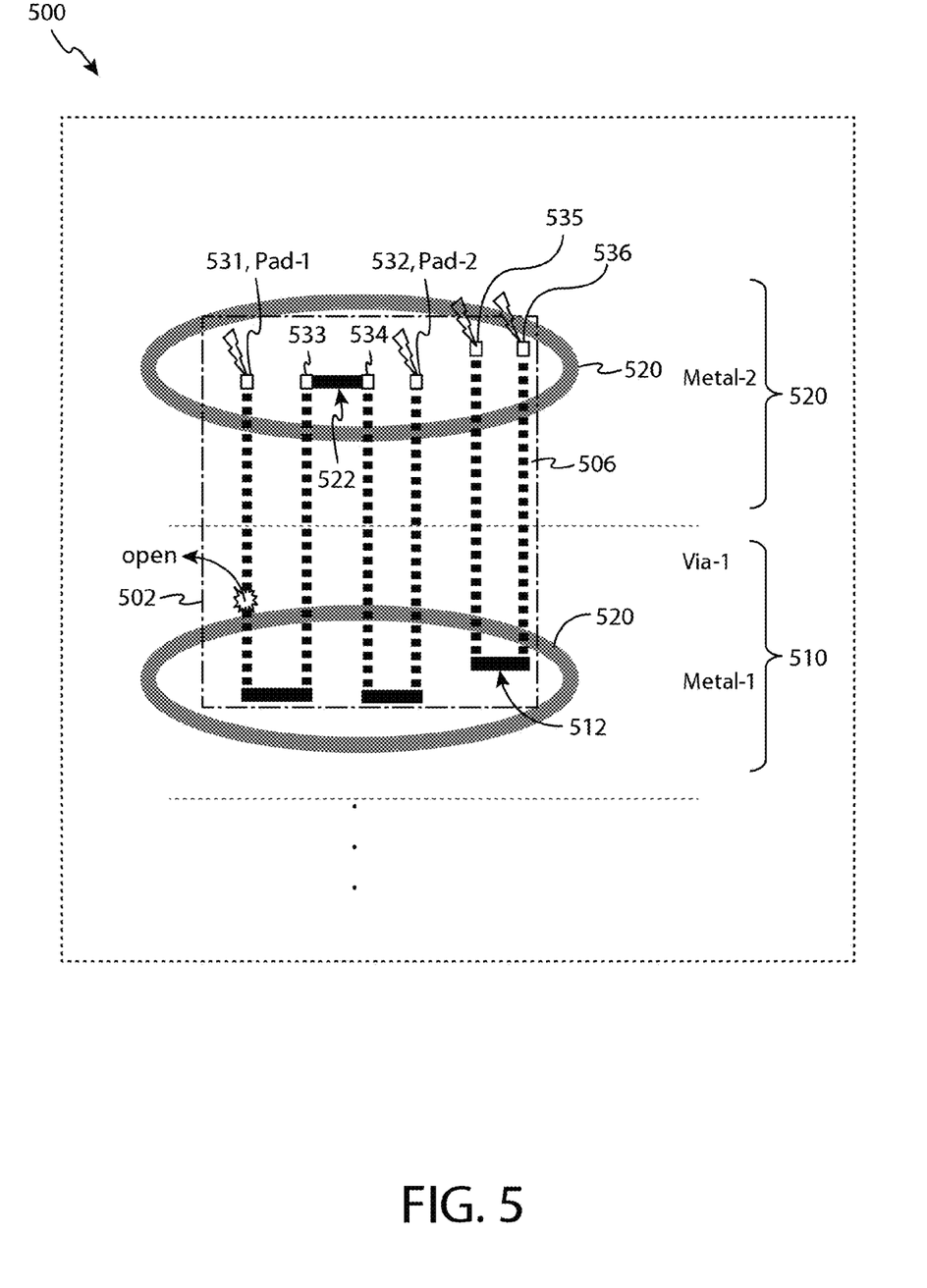
FIG. 5 illustrates an exemplary test structure having a conductive mesh in a middle portion of a semiconductor structure.

FIG. 5 illustrates an exemplary test structure 500 having a conductive mesh 502 in a middle portion of a 3D semiconductor structure. Conductive loops or rings 520 are shown in FIG. 5 for the purpose of illustration. Details of exemplary conductive loops or rings 520 are described in FIG. 3A and FIG. 4A. In some embodiments, conductive mesh 502 is in a middle portion of a semiconductor structure. Conductive mesh 502 in FIG. 5 is used to test a middle portion of the semiconductor structure.

In some embodiments, conductive mesh 502 is routed through scribe lines 512 and 522 within one respective tier 510 or 520 of the semiconductor structure, and routed through inter-level vias 506 connecting tiers in the semiconductor structure. A plurality of additional test pads 531-536 is connected with conductive mesh 502 on a surface tier 520 of the semiconductor structure. Conductive mesh 502 is configured to conduct a current between two of the plurality of additional test pads 531-536 on the surface tier 520.

A voltage can be applied to two of the plurality of additional test pads 531-536 on surface tier 520, and a corresponding current is then measured. A corresponding resistance value can be calculated. Based on the magnitude of the resistance value, absence or presence of any defects in the corresponding middle portion of the semiconductor structure and below the two test pads can be diagnosed.

Figure 6A:
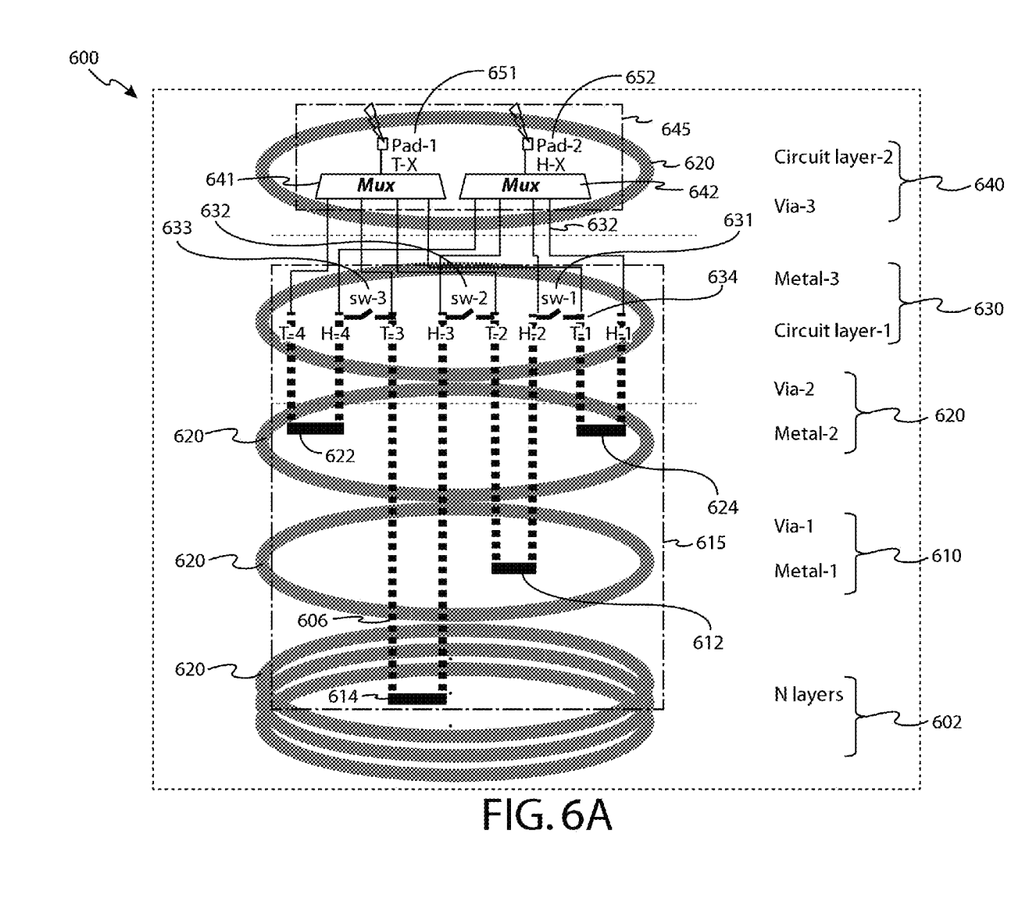
FIG. 6A illustrates an exemplary test structure having a "built-in" probe card and a conductive mesh in a middle portion of a semiconductor structure.

FIG. 6A illustrates an exemplary test structure 600 having a probing structure 645 and a conductive mesh 615 in a middle portion of a 3D semiconductor structure. Conductive loops or rings 620 are shown in FIG. 5 for the purpose of illustration. The probing structure 645 functions as a probe card but it is a "built-in" structure in the exemplary test structure 600. Details of exemplary conductive loops or rings 620 are described in FIG. 3A and FIG. 4A. In some embodiments, conductive mesh 615 is routed through scribe lines 612, 614, 622 and 624 within tiers 602, 612, 620 and 630 of the semiconductor structure, and routed through inter-level vias 606. A plurality of switches 631-633 are connected between two of the plurality of additional test pads or connection points 634 ($H_1$-$H_4$, $T_1$-$T_4$ in FIG. 6A) on tier 630.

Test structure 600 further comprises at least one probe pad 651 and 652 on the surface tier 640 of the semiconductor structure, and at least one multiplexer 641 and 642 (MUX). The at least one probe pad 651 and 652 and at least one multiplexer 641-642 (MUX) on surface tier 640 constitute a "built-in probe card" 645, providing the capability to electronically independently select two of the additional test pads 634, across which resistance is to be measured. The at least one multiplexer 641-642 is connected to the at least one probe pad 651-652, the plurality of switches 631-633, and the plurality of additional test pads 634 on tier 630. The at least one probe pad 651-652, a plurality of switches 631-633 and the at least one multiplexer 641-642 are configured to permit application of a voltage to a portion of conductive mesh 615 between two of the additional test pads 634, to measure a corresponding current therethrough.

Figure 6B:
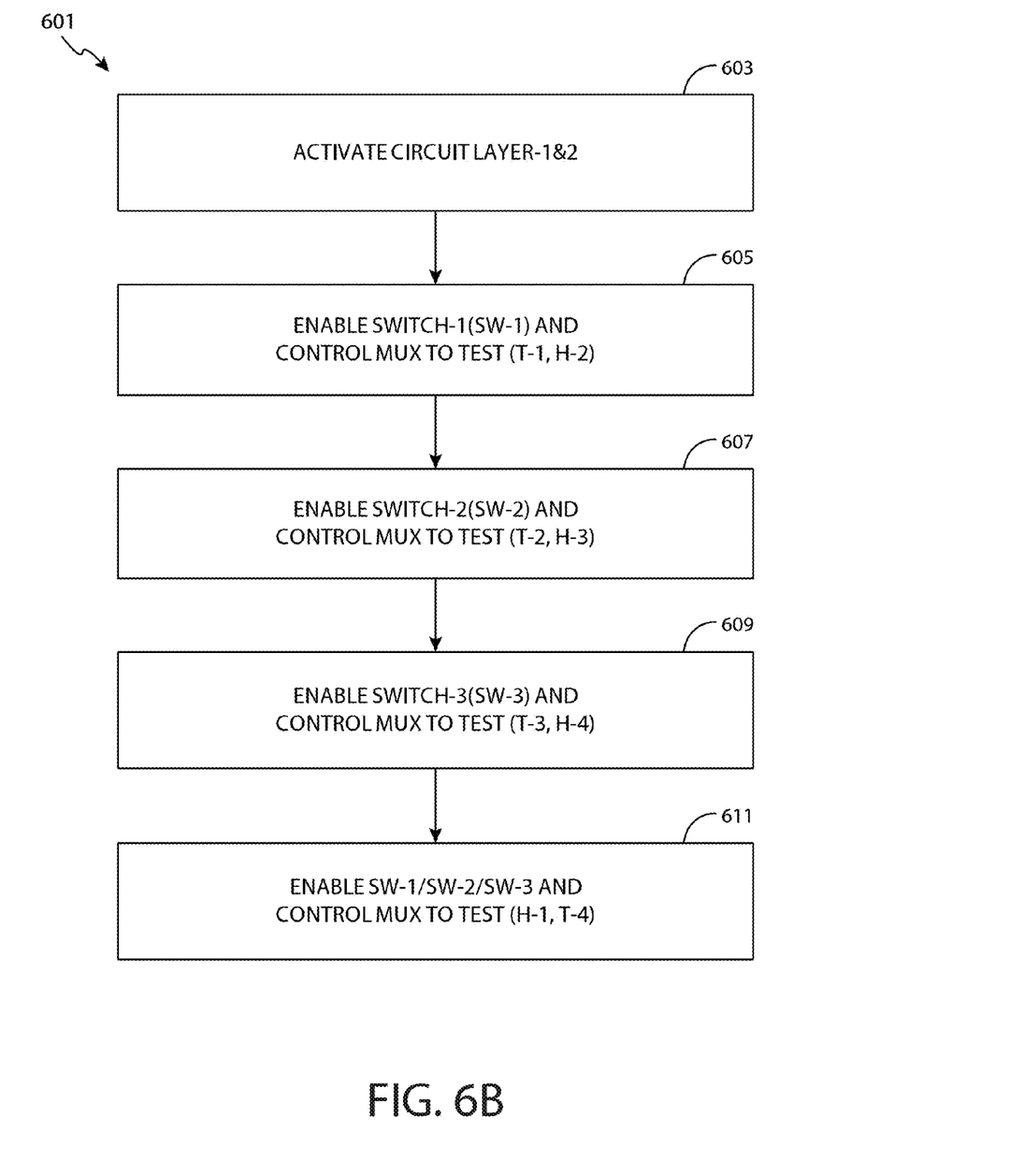
FIG. 6B illustrates an exemplary method for testing a semiconductor structure having a test structure of FIG. 6A.

FIG. 6B illustrates an exemplary method 601 for testing a semiconductor structure having a test structure 600 of FIG. 6A.

In method 601, at step 603, circuits in selected tiers, for example, tiers 610 and 620, are activated. At step 605, switch 631 (switch 1 in FIG. 6A) is enabled. The at least one multiplexer 641-642 is enabled to test the connection between test pads $T_1$ and $H_2$. The object of step 605 is to check whether switch 631 (switch 1) functions.

Similarly, at step 607, switch 632 (switch 2 in FIG. 6A) is enabled. The at least one multiplexer 641-642 is controlled to test the connection between test pads $T_2$ and $H_3$ to check switch 632 (switch 2). At step 609, switch 633 (switch 3 in FIG. 6A) is enabled. The at least one multiplexer 641-642 is controlled to test the connection between test pads $T_3$ and $H_4$ to check switch 633 (switch 3).

At step 611 of FIG. 6B, switches 631-633 (switches 1-3 in FIG. 6A) are enabled. The at least one multiplexer 641-642 is controlled to test the connection between test pads $T_4$ and $H_1$ (the whole conductive mesh 615). A voltage is applied and a corresponding current is measured. The resistance in the conductive mesh 615 across tiers 602, 610, 620 and 630 is then calculated. A low resistance value indicates absence of any defects. A high resistance value such as at the magnitude of million ohms indicates some defects in at least one of the tiers 602, 610, 620, and 630.

If the resulting resistance value is too high, for example, order of magnitude of one million ohms, indicating presence of defects, further steps can be taken to detect the location of the defects by testing a portion of the conductive mesh 615, using the steps described in FIG. 5.

Figure 7:
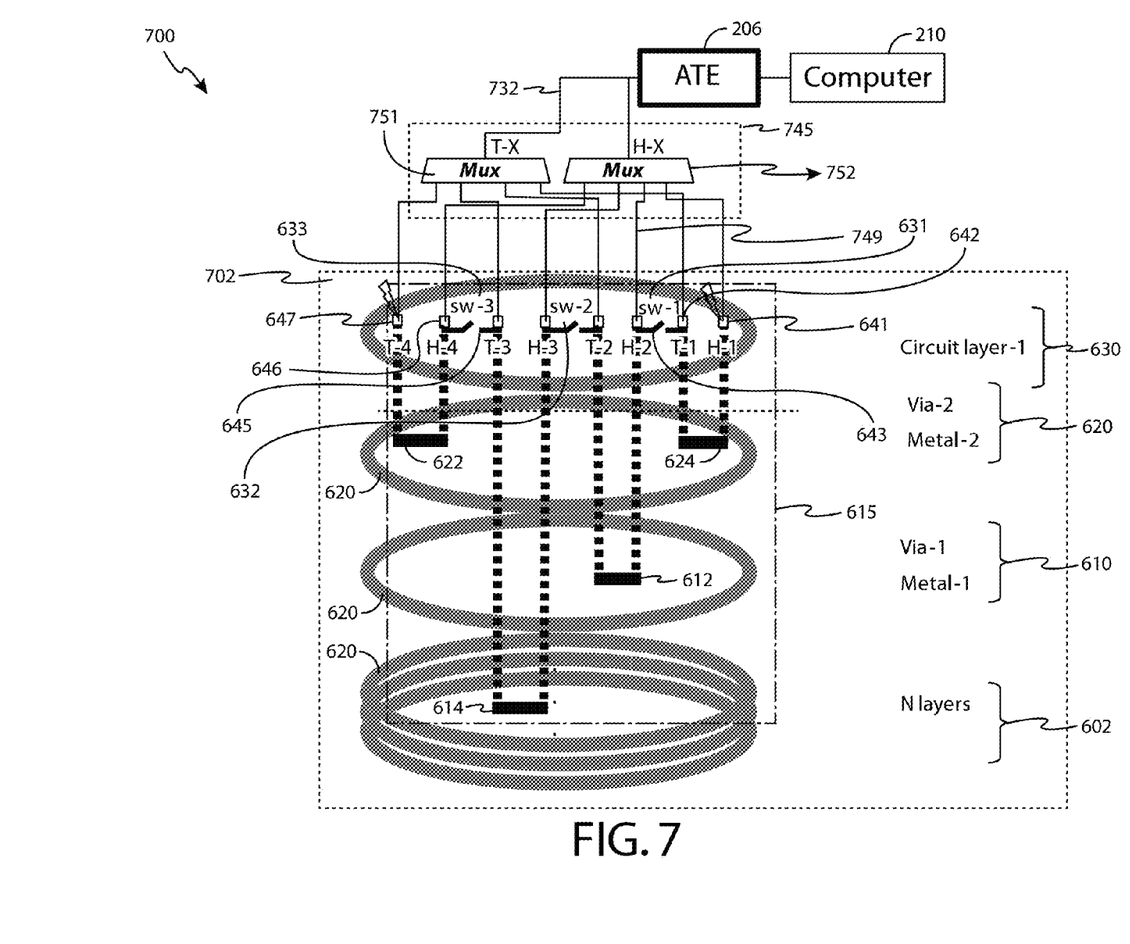
FIG. 7 illustrates an exemplary test structure having a conductive mesh connected with an external probe card.

FIG. 7 illustrates another exemplary test structure 700 having a conductive mesh 615 adapted to be connected with an external probe card 745. Test structure 700 is similar to test structure 600, except test structure 700 is adapted for selection of test pads by the external probe card 745, whereas test structure 600 has a "built-in probe card" 645 permitting selection by multiplexers within a surface tier 640.

In some embodiments, the conductive mesh 615 in test structure 700 is the same as described above with reference to FIG. 6A. In such embodiments, conductive mesh 615 comprises a plurality of switches 631-633 on the surface tier 630 (FIG. 7) of the semiconductor structure. One of the switches 631-633 is connected between two of the plurality of additional test pads 641-647 on the surface tier 630. The plurality of additional test pads 641-647 is configured to be contacted by an external probe card 745. The external probe card 745 is connected to a portion of the conductive mesh 615 between two of the additional test pads 641-647, for measuring a corresponding current therethrough. External probe card 745 has probe needles 749 (or the like) and at least one multiplexer 751-752.

External probe card 745 can be connected with a testing apparatus such as automatic testing equipment (ATE) 206 and a processor such as a computer 210 as described above with reference to FIG. 2.

Test structure 700 comprising conductive mesh 615 and external probe card 745 can function similar to test structure 600 comprising conductive mesh 615 and a "built-in probe card" 645. Exemplary method 601 can be used to test a semiconductor structure comprising test structure 700.

Figure 8A:
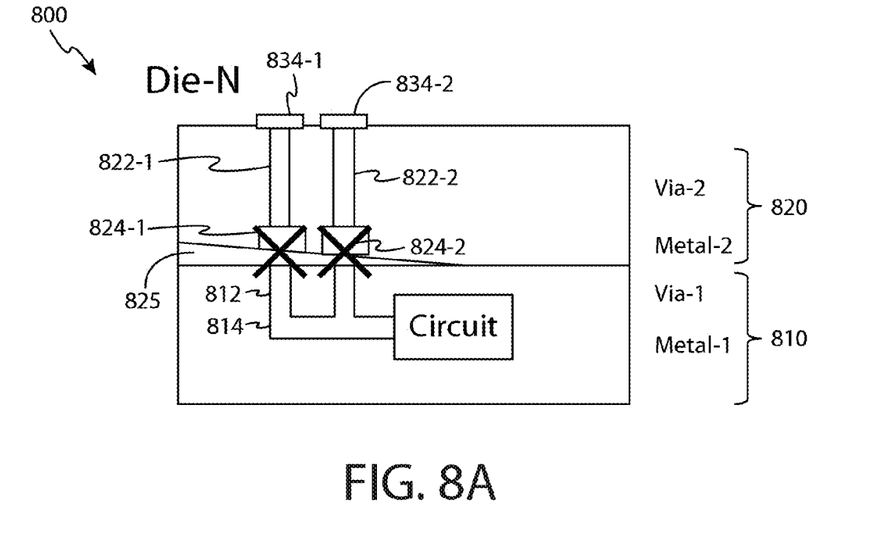
FIGS. 8A and 8B show an exemplary test structure having a pair of inter-level vias separated from each other by a predetermined distance.
Figure 8B:
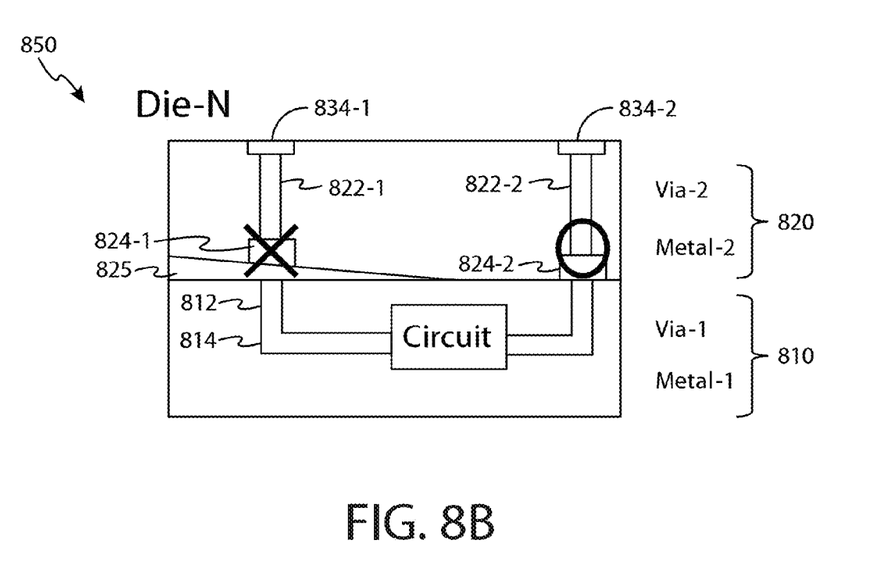

FIGS. 8A and 8B show exemplary 3D ICs including test structures 800 and 850 having a pair of inter-level vias 822-1 and 822-2 separated from each other by a predetermined distance. A pair of inter-level vias 822-1 and 822-2 each provides a backup path for the other if one conductive path has an open connection due to defects.

The pair of inter-level vias 822-1 and 822-2 can be connected to a conductive ring in a conductive loop or a conductive mesh as described above. The pair of inter-level vias 822-1 and 822-2 can also be connected to an integrated circuit. The pair of inter-level vias 822-1 and 822-2 can be connected to other conductive paths in another tier, such as vias 812 and conductive lines 814 in tier 810, and other conductive paths in the same tier 824-1 and 824-2 in tier 820. Inter-level vias 822-1 and 822-2 are connected to test pads 834-1 and 834-2 on a surface tier in some embodiments.

As shown in FIG. 8A, if the pair of inter-level vias 822-1 and 822-2 is separated by a distance smaller than or close to the size of a defect such as a crack 825 between tiers 810 and 820, both pathways from the pair of inter-level vias 822-1 and 822-2 can have open connections because of the same crack 825.

However, as shown in FIG. 8B, if the pair of inter-level vias 822-1 and 822-2 is sufficiently separated by a distance that is larger than a predicted crack size (e.g., the 3σ crack size), the second conductive path from via 822-2 and conductive line 824-2 has a good connection, even though the first conductive path from via 822-1 and conductive line 824-1 may have an open connection due to crack 825. The second conductive path from via 822-2 and conductive line 824-2 can be a backup for the first conductive path from via 822-1 and conductive line 824-1.

Figure 9:
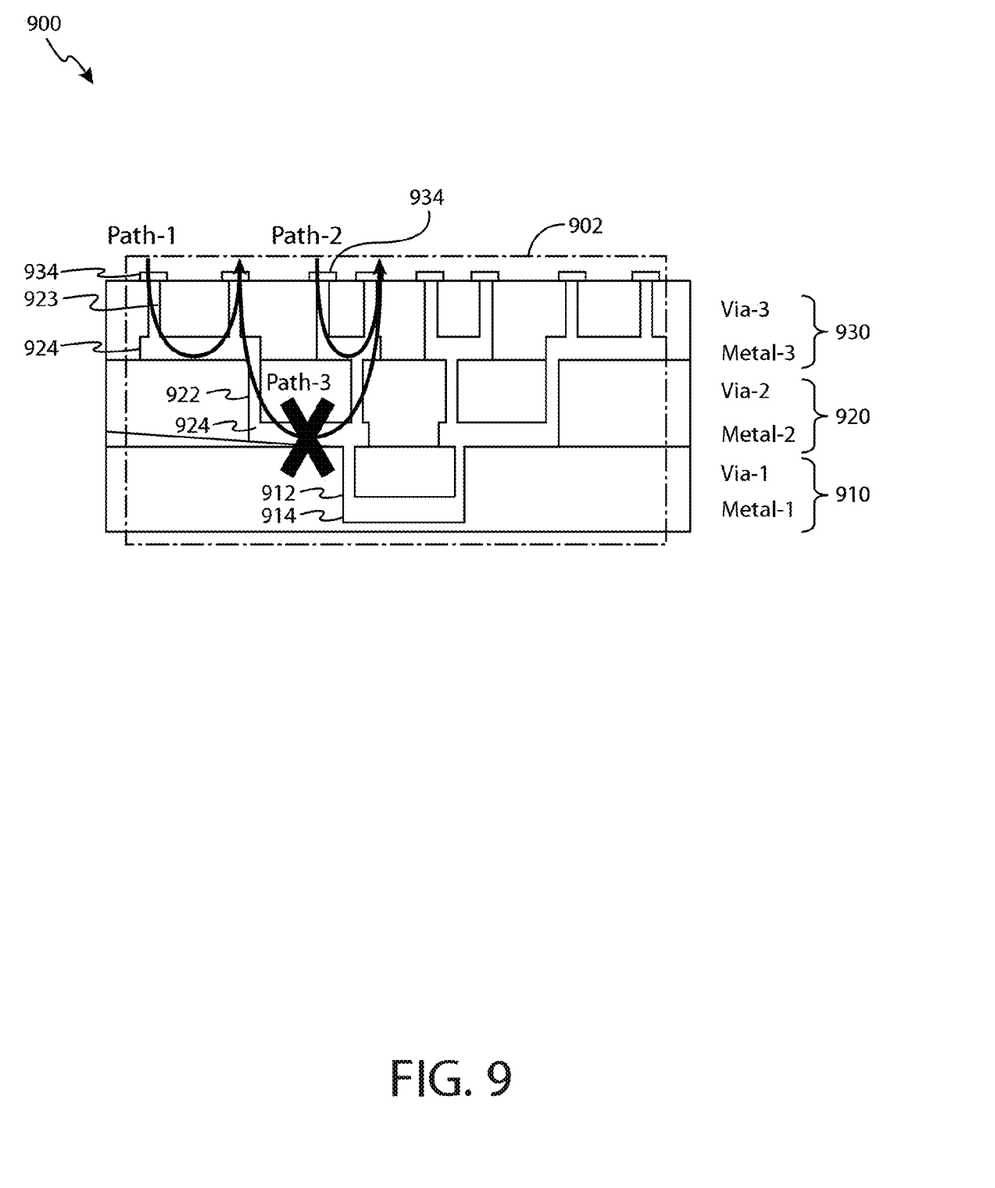
FIG. 9 illustrates an exemplary test structure having a tree structure and extending across the plurality of tiers in the semiconductor structure.

FIG. 9 illustrates an exemplary test structure 900 having a conductive mesh 902 having a tree structure and extending across the plurality of tiers 910-930 in the 3D semiconductor structure.

As illustrated in FIG. 9, inter-level vias 912 and conductive line 914 in tier 910 branch out to connect to other inter-level vias and segments of conductive lines. The resulting conductive mesh 902 having a tree structure extends across the plurality of tiers 910-930 in the semiconductor structure. In tier 920, inter-level vias 922 and conductive lines 924 form at least two conductive paths. In tier 930 above tier 920, inter-level vias 923 and conductive lines 924 forms at least four paths, which are connected to test pads 934. Conductive mesh 902 having a tree structure can extend from a middle portion of a semiconductor structure to the periphery of the semiconductor structure in some embodiments.

Test structure 900 having a tree structure can be used to test a 3D semiconductor structure having such a test structure 900. For example, resistance of paths 1-3 can be measured. If the resistances of path 1 and path 2 are low, for example, in the range of from 10 ohms to 100 ohms, the areas adjacent to path 1 and path 2 of FIG. 9 have no defects. However, if the resistance of path 3 is high, for example, at the level of million ohms, the results indicate presence of defects in the areas adjacent to path 3 of FIG. 9 in tier 920.

The present disclosure also provides a semiconductor structure having a plurality of tiers and comprising one of exemplary test structures 300, 400, 500, 600, 700, 850, and 900 as described above.

The present disclosure provides a test structure for testing a 3D semiconductor structure having a plurality of tiers, a semiconductor structure comprising such a test structure, a system comprising such a structure, and a method for testing a 3D semiconductor structure having a plurality of tiers using such a test structure. The test structure is configured to permit detection of defects within each of the plurality of tiers in the semiconductor structure if the defects exist, using a testing apparatus.

In some embodiments, the test structure comprises at least one conductive loop. Each respective conductive loop has ends defining at least one opening therebetween, and is embedded inside one or more of the plurality of tiers in the semiconductor structure. The test structure also comprises at least two test pads on each respective conductive loop. The at least two test pads are connected with respective ends of each respective conductive loop. In some embodiments, the 3D semiconductor structure comprises a stacked complementary metal-oxide-semiconductor (CMOS) device. The semiconductor structure can be a wafer comprising three-dimensional (3-D) integrated circuits.

In some embodiments, at least one respective conductive loop comprises at least one conductive ring at the periphery of the one or more tiers in the semiconductor structure. The at least one conductive ring is connected with each other through inter-level vias across two adjacent tiers of the semiconductor structure to form the respective conductive loop.

In some embodiments, the at least one conductive loop comprises at least two conductive loops having substantially identical shape and length, and each respective loop has a different line width.

In some embodiments, the at least one conductive loop comprises a first number of conductive loops having the same line width as each other. Each respective conductive loop is divided across a second number of tiers in the semiconductor structure. The second number is different from the first number.

In some embodiments, the test structure further comprises a conductive mesh in a middle portion of the semiconductor structure. The conductive mesh is routed through scribe lines within one respective tier of the semiconductor structure, and routed through inter-level vias connecting tiers in the semiconductor structure. A plurality of additional test pads is connected with the conductive mesh on a surface tier of the semiconductor structure. The conductive mesh is configured to conduct a current between two of the plurality of additional test pads on the surface tier.

In some embodiments, the test structure further comprises at least one probe pad on the surface tier of the semiconductor structure, a plurality of switches between two of the plurality of additional test pads on the surface tier, and at least one multiplexer. The at least one multiplexer is connected to the at least one probe pad, the plurality of switches, and the plurality of additional test pads on the surface tier of the semiconductor structure. The at least one probe pad, a plurality of switches and the at least one multiplexer are configured to permit application of a voltage to a portion the conductive mesh between two of the additional test pads in the surface tier, to measure a corresponding current therethrough.

In some embodiments, the test structure further comprises a plurality of switches on the surface tier of the semiconductor structure. One of the switches is connected between two of the plurality of additional test pads on the surface tier. The plurality of additional test pads is configured to connect with an external probe card. The external probe card is connected to a portion the conductive mesh between two of the additional test pads in the surface tier, for measuring a corresponding current therethrough.

In some embodiments, the conductive mesh has a tree structure and extends across the plurality of tiers in the semiconductor structure. In some embodiments, one of the inter-level vias comprises a pair of inter-level vias separated from each other by a predetermined distance.

The present disclosure also provides a 3D semiconductor structure having a plurality of tiers and comprising a test structure for testing the 3D semiconductor structure as described above. The test structure comprises at least one conductive loop. Each respective conductive loop has ends defining at least one opening therebetween, and is embedded inside one or more of the plurality of tiers in the semiconductor structure. The test structure also has at least two test pads on each respective conductive loop. The at least two test pads are connected with respective ends of the at least one opening of each respective conductive loop. The 3D semiconductor structure can be a wafer comprising a stacked complementary metal-oxide-semiconductor (CMOS) device.

In some embodiments, in the test structure, at least one respective conductive loop comprises at least one conductive ring at the periphery of the one or more tiers in the semiconductor structure. The at least one conductive ring is connected with each other through inter-level vias across two adjacent tiers of the semiconductor structure to form the respective conductive loop.

In some embodiments, the test structure in the semiconductor structure further comprises a conductive mesh and a plurality of additional test pads. The conductive mesh is in a middle portion of the semiconductor structure. The conductive mesh is routed through scribe lines within one respective tier of the semiconductor structure, and routed through inter-level vias connecting tiers in the semiconductor structure. A plurality of additional test pads is connected with the conductive mesh on a surface tier of the semiconductor structure. The conductive mesh is configured to conduct a current between two of the plurality of additional test pads on the surface tier.

In some embodiments, the test structure in the semiconductor structure further comprises at least one probe pad on the surface tier of the semiconductor structure, a plurality of switches between two of the plurality of additional test pads on the surface tier, and at least one multiplexer. The at least one multiplexer is connected to the at least one probe pad, the plurality of switches, and the plurality of additional test pads on the surface tier of the semiconductor structure. The at least one probe pad, a plurality of switches and the at least one multiplexer are configured to permit application of a voltage to a portion the conductive mesh between two of the plurality of additional test pads in the surface tier, to measure a corresponding current therethrough.

In some embodiments, the test structure in the semiconductor structure further comprises a plurality of switches on the surface tier of the semiconductor structure. One of the switches is connected between two of the plurality of additional test pads on the surface tier. The plurality of additional test pads is configured to connect with an external probe card. The external probe card is connected to a portion the conductive mesh between two of the plurality of additional test pads in the surface tier, for measuring a corresponding current therethrough.

In some embodiments, a semiconductor structure provided in this present disclosure comprises a stacked complementary metal-oxide-semiconductor (CMOS) device having a plurality of tiers in a wafer, and a test structure for testing the semiconductor structure. The test structure comprises at least one conductive loop. Each respective conductive loop has ends defining at least one opening therebetween and is embedded inside one or more of the plurality of tiers in the semiconductor structure. The test structure also has at least two test pads on each respective conductive loop. The at least two test pads are connected with respective ends of the at least one opening of each respective conductive loop. The test structure also comprises a conductive mesh and a plurality of additional test pads. The conductive mesh is in a middle portion of the semiconductor structure. The conductive mesh is routed through scribe lines within one respective tier of the semiconductor structure, and routed through inter-level vias connecting tiers in the semiconductor structure. A plurality of additional test pads is connected with the conductive mesh on a surface tier of the semiconductor structure. The conductive mesh is configured to conduct a current between two of the plurality of test pads on the surface tier. In some embodiments, the conductive mesh has a tree structure and extends across the plurality of tiers in the semiconductor structure.

Although the subject matter has been described in terms of exemplary embodiments, it is not limited thereto. Rather, the appended claims should be construed broadly, to include other variants and embodiments, which may be made by those skilled in the art.

What is claimed is:

1. A test structure for testing a 3D semiconductor structure having a plurality of tiers, comprising
   at least one conductive loop, each respective conductive loop comprising two pairs of ends in a top tier of the plurality of tiers and being embedded inside two or more of the plurality of tiers in the semiconductor structure, a first pair of ends and a second pair of ends being in a same loop and each defining one opening therebetween; and
   at least two test pads on each respective conductive loop, the at least two test pads electrically connected with respective ends of each respective conductive loop, wherein
   each respective conductive loop comprises at least one conductive ring in the two or more of the plurality of tiers; and
   the respective conductive rings in at least two of the plurality of tiers are electrically connected with each other through inter-level vias across two adjacent tiers of the plurality of tiers and through the second pair of ends in the top tier to form the respective conductive loop.

2. The test structure of claim 1, wherein
   the test structure is configured to permit detection of defects within each of the plurality of tiers in the semiconductor structure if the defects exist, using a testing apparatus.

3. The test structure of claim 1, wherein the at least one conductive loop is at least two conductive loops having substantially identical shape and length, and each respective loop has a different line width.

4. The test structure of claim 1, wherein
   the at least one conductive loop is a first number of conductive loops having the same line width as each other; and
   each respective conductive loop is divided across a second number of tiers in the semiconductor structure, wherein the second number is different from the first number.

5. The test structure of claim 1, further comprising
   a conductive mesh in a middle portion of the semiconductor structure, the conductive mesh routed through scribe lines within one respective tier of the semiconductor structure, and routed through inter-level vias connecting tiers in the semiconductor structure; and
   a plurality of additional test pads electrically connected with the conductive mesh on a surface tier of the semiconductor structure;
   wherein the conductive mesh is configured to conduct a current between two of the plurality of additional test pads on the surface tier.

6. The test structure of claim 5, further comprising
   at least one probe pad on the surface tier of the semiconductor structure;
   a plurality of switches between two of the plurality of additional test pads on the surface tier, and
   at least one multiplexer electrically connected to the at least one probe pad, the plurality of switches, and the plurality of additional test pads on the surface tier of the semiconductor structure;
   wherein the at least one probe pad, a plurality of switches and the at least one multiplexer are configured to permit application of a voltage to a portion the conductive mesh between two of the additional test pads in the surface tier, to measure a corresponding current therethrough.

7. The test structure of claim 5, further comprising
   a plurality of switches on the surface tier of the semiconductor structure, one of the switches electrically connected between two of the plurality of additional test pads on the surface tier,
   wherein the plurality of additional test pads are configured to connect with an external probe card, and the external probe card is electrically connected to a portion the conductive mesh between two of the additional test pads in the surface tier, for measuring a corresponding current therethrough.

8. The test structure of claim 5, wherein
   the conductive mesh has a tree structure and extends across the plurality of tiers in the semiconductor structure, wherein the tree structure comprises a respective scribe line within one respective tier branched into two conductive lines within an adjacent tier.

9. The test structure of claim 5, wherein
   one of the inter-level vias comprises a pair of inter-level vias separated from each other by a predetermined distance.

10. A semiconductor structure having a plurality of tiers and comprising a test structure for testing the semiconductor structure, the test structure comprising
    at least one conductive loop, each respective conductive loop comprising two pairs of ends in a top tier of the plurality of tiers and being embedded inside two or more of the plurality of tiers in the semiconductor structure, a first pair of ends and a second pair of ends being in a same loop and each defining one opening therebetween; and
    at least two test pads on each respective conductive loop, the at least two test pads electrically connected with respective ends of the at least one opening of each respective conductive loop,
    wherein
    each respective conductive loop comprises at least one conductive ring in the two or more of the plurality of tiers; and
    the respective conductive rings in at least two if the plurality of tiers are electrically connected with each other through inter-level vias across two adjacent tiers of the plurality of tiers and through the second pair of ends in the top tier to form the respective conductive loop.

11. The semiconductor structure of claim 10, wherein
    the test structure is configured to permit detection of defects within each of the plurality of tiers in the semiconductor structure if the defects exist, using a testing apparatus.

12. The semiconductor structure of claim 10, wherein the at least one conductive loop is at least two conductive loops having substantially identical shape and length, and each respective loop has a different line width.

13. The semiconductor structure of claim 10, wherein
the at least one conductive loop is a first number of conductive loops having the same line width as each other; and
each respective conductive loop is divided across a second number of tiers in the semiconductor structure, wherein the second number is different from the first number.

14. The semiconductor structure of claim 10, wherein the test structure further comprises
a conductive mesh in a middle portion of the semiconductor structure, the conductive mesh routed through scribe lines within one respective tier of the semiconductor structure, and routed through inter-level vias connecting tiers in the semiconductor structure; and
a plurality of additional test pads electrically connected with the conductive mesh on a surface tier of the semiconductor structure;
wherein the conductive mesh is configured to conduct a current between two of the plurality of additional test pads on the surface tier.

15. The semiconductor structure of claim 14, wherein the test structure further comprises
at least one probe pad on the surface tier of the semiconductor structure;
a plurality of switches between two of the plurality of additional test pads on the surface tier, and
at least one multiplexer electrically connected to the at least one probe pad, the plurality of switches, and the plurality of additional test pads on the surface tier of the semiconductor structure;
wherein the at least one probe pad, a plurality of switches and the at least one multiplexer are configured to permit application of a voltage to a portion the conductive mesh between two of the plurality of additional test pads in the surface tier, to measure a corresponding current therethrough.

16. The semiconductor structure of claim 14, wherein the test structure further comprises
a plurality of switches on the surface tier of the semiconductor structure, one of the switches electrically connected between two of the plurality of additional test pads on the surface tier,
wherein the plurality of additional test pads are configured to connect with an external probe card, and the external probe card is electrically connected to a portion the conductive mesh between two of the plurality of additional test pads in the surface tier, for measuring a corresponding current therethrough.

17. A semiconductor structure, comprising
a stacked complementary metal-oxide-semiconductor (CMOS) device having a plurality of tiers in a wafer, and
a test structure for testing the semiconductor structure, the test structure comprising
at least one conductive loop, each respective conductive loop comprising two pairs of ends in a top tier of the plurality of tiers and being embedded inside one or more of the plurality of tiers in the semiconductor structure, a first pair of ends and a second pair of ends being in the same of loop and each defining one opening therebetween;
at least two test pads on each respective conductive loop, the at least two test pads electrically connected with respective ends of the at least one opening of each respective conductive loop; wherein:
each respective conductive loop comprises at least one conductive ring in the two or more of the plurality of tiers; and
the respective conductive rings of at least two of the plurality of tiers are electrically connected with each other through inter-level vias across two adjacent tiers of the plurality of tiers and through the second pair of ends in the top tier to form the respective conductive loop;
a conductive mesh in a middle portion of the semiconductor structure, the conductive mesh routed through scribe lines within one respective tier of the semiconductor structure, and routed through inter-level vias connecting tiers in the semiconductor structure; and
a plurality of additional test pads electrically connected with the conductive mesh on a surface tier of the semiconductor structure;
wherein the conductive mesh is configured to conduct a current between two of the plurality of test pads on the surface tier.

18. The semiconductor structure of claim 17, the conductive mesh has a tree structure and extends across the plurality of tiers in the semiconductor structure, wherein the tree structure comprises a respective scribe line within one respective tier branched into two conductive lines within an adjacent tier.

* * * * *